(12) United States Patent
Iwao et al.

(10) Patent No.: US 12,300,466 B2
(45) Date of Patent: May 13, 2025

(54) PLASMA ENHANCED FILM FORMATION METHOD

(71) Applicant: Tokyo Electron Limited, Tokyo (JP)

(72) Inventors: Toshihiko Iwao, Austin, TX (US); Jianping Zhao, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 727 days.

(21) Appl. No.: 17/521,359

(22) Filed: Nov. 8, 2021

(65) Prior Publication Data

US 2023/0143204 A1 May 11, 2023

(51) Int. Cl.
*H01L 21/02* (2006.01)
*H01J 37/32* (2006.01)
*H01L 21/66* (2006.01)

(52) U.S. Cl.
CPC .. *H01J 37/32449* (2013.01); *H01J 37/32146* (2013.01); *H01J 37/3299* (2013.01); *H01L 21/0217* (2013.01); *H01L 21/02211* (2013.01); *H01L 21/02274* (2013.01); *H01L 21/0228* (2013.01); *H01L 22/26* (2013.01); *H01J 2237/3321* (2013.01)

(58) Field of Classification Search
CPC .......... H01J 37/32146; H01J 37/32449; H01J 37/3299; H01J 2237/3321; H01L 21/0217; H01L 21/02211; H01L 21/02274; H01L 21/0228; H01L 22/26

USPC ......................................................... 438/446
See application file for complete search history.

(56) References Cited

U.S. PATENT DOCUMENTS

| 2005/0039681 A1* | 2/2005 | Fukiage ............. C23C 16/5096 |
| | | 118/723 E |
| 2012/0220139 A1 | 8/2012 | Lee |
| 2016/0314960 A1 | 10/2016 | Cheng |
| 2017/0323785 A1 | 11/2017 | Singhal |
| 2018/0323057 A1 | 11/2018 | Kumar |
| 2020/0258720 A1 | 8/2020 | Nittala |

OTHER PUBLICATIONS

Hwang et al., "Plasma-Enhanced Atomic-Layer Deposition of Nanometer-Thick SINx Films Using Trichlorodisilane for Etch-Resistant Coatings", ACS Applied Nano Materials, https://dx.doi.org/10.1021/acsam.0c03203, www. acsanm.org, downloaded Mar. 23, 2021, 7 pages.

(Continued)

*Primary Examiner* — Monica D Harrison
(74) *Attorney, Agent, or Firm* — Slater Matsil, LLP

(57) ABSTRACT

A method of plasma processing that includes: flowing a first gas and a second gas into a plasma processing chamber including a substrate, the second gas including a film precursor; at a first time instance, while maintaining the flow of the first gas, shutting off the flow of the second gas into the plasma processing chamber; and at a second time instance after the first time instance, powering an electrode of the plasma processing chamber to generate a plasma within the plasma processing chamber, the surface of the substrate being exposed to the generated plasma to form a film over the substrate.

20 Claims, 9 Drawing Sheets

(56) References Cited

OTHER PUBLICATIONS

Park et al., "Plasma-enhanced atomic layer deposition of silicon nitride using novel silylamine precursor", ACS Applied Materials & Interfaces, Publication Date Jul. 22, 2016, Downloaded from http://pubs.acs.org on Jul. 24, 2016, Republic of Korea, 29 pages.

Szymanski et al., "Effect of wall conditions on the self-limiting deposition of metal oxides by pulsed plasma-enhanced chemical vapor deposition", Journal of Vacuum Science & Technology A25 1493 (2007), http://doi.org/10.1116/1.2779039, published Sep. 10, 2007, 8 pages.

International Search Report and Written Opinion, PCT Application No. PCT/US2022/049070, mailed Mar. 16, 2023, 10 pages.

* cited by examiner

PLASMA ENHANCED FILM FORMATION METHOD

TECHNICAL FIELD

The present invention relates generally to plasma processing, and, in particular embodiments, to methods of plasma enhanced film formation.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Scaling efforts to increase the number of interconnect elements per unit area are running into greater challenges as scaling enters nanometer-scale semiconductor device fabrication nodes. Therefore, there is a desire for three-dimensional (3D) semiconductor devices in which transistors are stacked on top of each other.

As device structures densify and develop vertically, the desire for precision material processing, for example during deposition and patterning, becomes more compelling. Thus, further innovations are desired in various deposition techniques such as chemical vapor deposition (CVD), physical vapor deposition (PVD), and atomic layer deposition (ALD), to provide sufficient profile control, film conformality, and film quality among others.

SUMMARY

In accordance with an embodiment of the present invention, a method of plasma processing that includes: flowing a first gas and a second gas into a plasma processing chamber including a substrate, the second gas including a film precursor; at a first time instance, while maintaining the flow of the first gas, shutting off the flow of the second gas into the plasma processing chamber; and at a second time instance after the first time instance, powering an electrode of the plasma processing chamber to generate a plasma within the plasma processing chamber, the surface of the substrate being exposed to the generated plasma to form a film over the substrate.

In accordance with an embodiment of the present invention, a method of forming a film over a substrate that includes: flowing a first gas to a plasma processing chamber holding the substrate; while flowing the first gas, performing a cyclic plasma process, the cyclic plasma process including a plurality of cycles, each of the plurality of the cycles including: pulsing a second gas including a film precursor into the plasma processing chamber; and applying a first pulse of power to an electrode coupled to the plasma processing chamber to generate a plasma to form gaseous intermediate species from the film precursor, the gaseous intermediate species being deposited over the substrate to form the film.

In accordance with an embodiment of the present invention, a method of plasma processing that includes: flowing a first gas and a second gas including into a plasma processing chamber including a substrate, the second gas including a film precursor, the film precursor including H, B, C, N, O, F, Si, Ti, Fe, Co, Cu, Zn, Ga, Ge, As, Y, Zr, In, Sn, Sb, Hf, Ta, or W, where a temperature of the substrate is at 500° C. or lower; at a first time instance, powering an electrode of the plasma processing chamber to generate a plasma within the plasma processing chamber, the surface of the substrate being exposed to the generated plasma to form a film over the substrate; and at a second time instance, while maintaining the flow of the first gas, shutting off the flow of the second gas into the plasma processing chamber.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross sectional views of a substrate with recesses at various stages during an exemplary pulse-shot plasma enhanced chemical vapor deposition (ps-PECVD) process in accordance with various embodiments, wherein FIG. 1A illustrates a substrate while flowing a first gas and a second process gas, FIG. 1B illustrates the substrate after stopping to flow the second process gas, FIG. 1C illustrates the substrate at a pulse-shot plasma step, and FIG. 1D illustrates the substrate at a post-plasma film growth stage;

FIGS. 2A-2C illustrate timing diagrams for a ps-PECVD process in accordance with various embodiment, wherein FIG. 2A illustrates one cycle of a cyclic implementation in accordance with one embodiment, FIG. 2B illustrates three cycles in accordance with another embodiment, and FIG. 2C illustrates three cycles in accordance with an alternate embodiment;

FIGS. 3A and 3B illustrate cross sectional views of a substrate with recesses after a ps-PECVD process in accordance with various embodiments with different resulting film structures, wherein FIG. 3A illustrates the substrate having a conformal film deposited, and FIG. 3B illustrates the substrate with a non-uniform film deposited;

FIGS. 4A-4C illustrate process flow diagrams of a ps-PECVD in accordance with various embodiments, wherein FIG. 4A illustrates an embodiment, FIG. 4B illustrates an embodiment of a cyclic implementation, and FIG. 4C illustrates another embodiment.

DETAILED DESCRIPTION OF ILLUSTRATIVE EMBODIMENTS

Figure 1A:
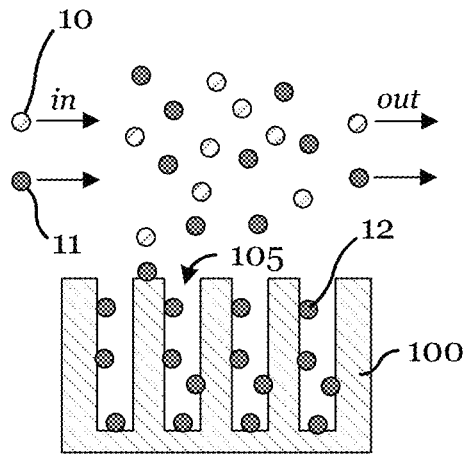

This application relates to a method of plasma enhanced film formation, more particularly to a method of low-temperature plasma enhanced chemical vapor deposition (PECVD) utilizing short plasma pulsing to generate intermediate species from a residual amount of a precursor in the gas phase, referred to as pulse-shot PECVD (ps-PECVD) in this disclosure. With scaling efforts in semiconductor fabrication processes, it becomes more imperative to achieve conformal film coverage with high aspect ratio structures and/or 3D structures. However, currently available deposition techniques (e.g., thermal processes and PECVD processes) may not meet increasing industry requirements because of several drawbacks. For example, conventional thermal processes may require high temperature (typically >600° C.) for depositing a reliable film. On the other hand, conventional PECVD that may be performed at moderate or low temperatures may suffer the inability to achieve good conformal films on patterned features. As an alternative, atomic layer deposition (ALD) processes may provide sufficient film conformality, yet ALD processes are generally slow (e.g. a film growth rate of 1-2 nm/min.) and expensive. Further, ALD processes may also require high temperatures (e.g., >400° C.). Therefore, a low-temperature (e.g., <400° C.) deposition technique to achieve conformal film coverage and quality with a reasonable film growth rate may be desired. Embodiments of the present application disclose methods of low-temperature pulse-shot plasma enhanced chemical deposition (ps-PECVD) that enables such deposition performance. In an embodiment, a silicon dielectric film such as silicon nitride may be formed conformally over a 3D structure of a substrate at a temperature below 500° C.

The methods described in this disclosure is based on a pulse-shot plasma enhanced chemical vapor deposition (ps-PECVD), and may advantageously lower the process temperature necessary to form a conformal film over a 3D structure of a substrate compared to typical thermal processes. Avoiding high temperature may be beneficial to device properties and process integration in both logic and memory device applications. The conformal film growth of the methods at low temperatures is enabled by short plasma pulsing to generate intermediate species from a residual amount of a precursor in the gas phase, which are then deposited on the surface to uniformly grow the film. Cycles of plasma pulsing may be repeated to grow a desired thickness of the film, while maintaining the film conformality. In addition, various embodiments of the ps-PECVD process may also provide a shorter purge time and a film growth rate that is faster than typical ALD methods. Further, the ps-PECVD method may offer a low wet etch rate (WER) as well as a uniform distribution of WER across the film, which are some of the key factors for film quality. The use of shot plasma pulsing may beneficially reduce ion damage to active components of the system on a chip (SOC) as well as to the processing system.

In various embodiments, the ps-PECVD process may comprise four stages: (1) the flow-in stage where at least two gases are flowed in to a plasma processing chamber; (2) the flow-stop stage where the inflow of one of the two gases is stopped; (3) pulse-shot plasma stage where a plasma is generated for a short period of time; and (4) post-plasma film growth stage where a film is formed over a substrate primarily from intermediate species formed by the plasma in the stage (3).

Figure 4A:
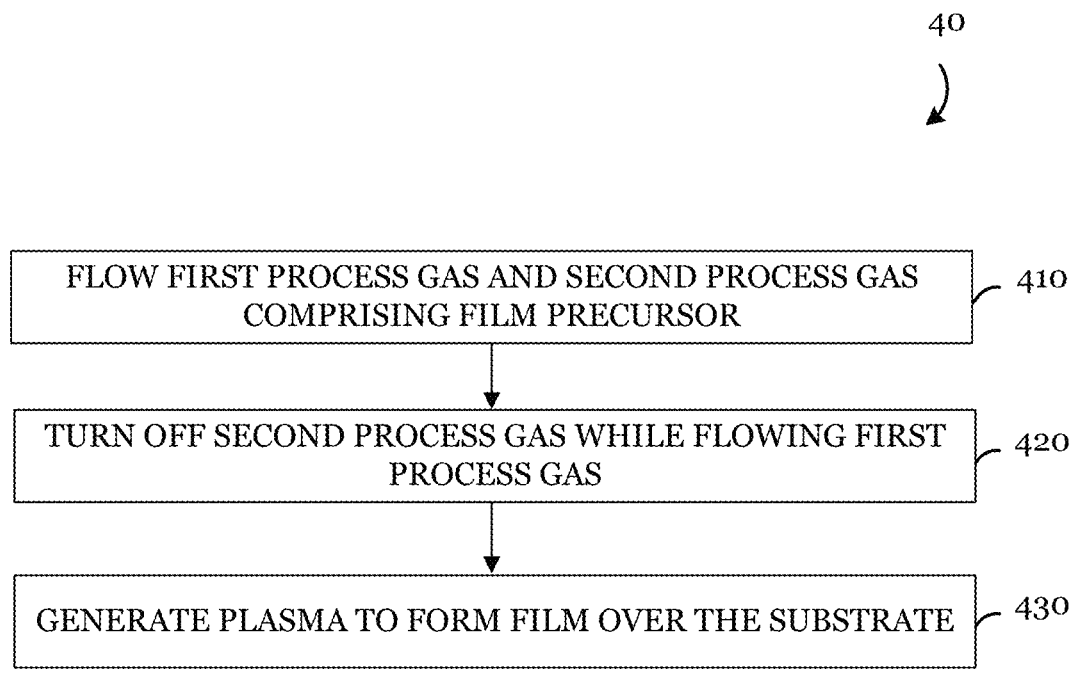
Figure 4B:
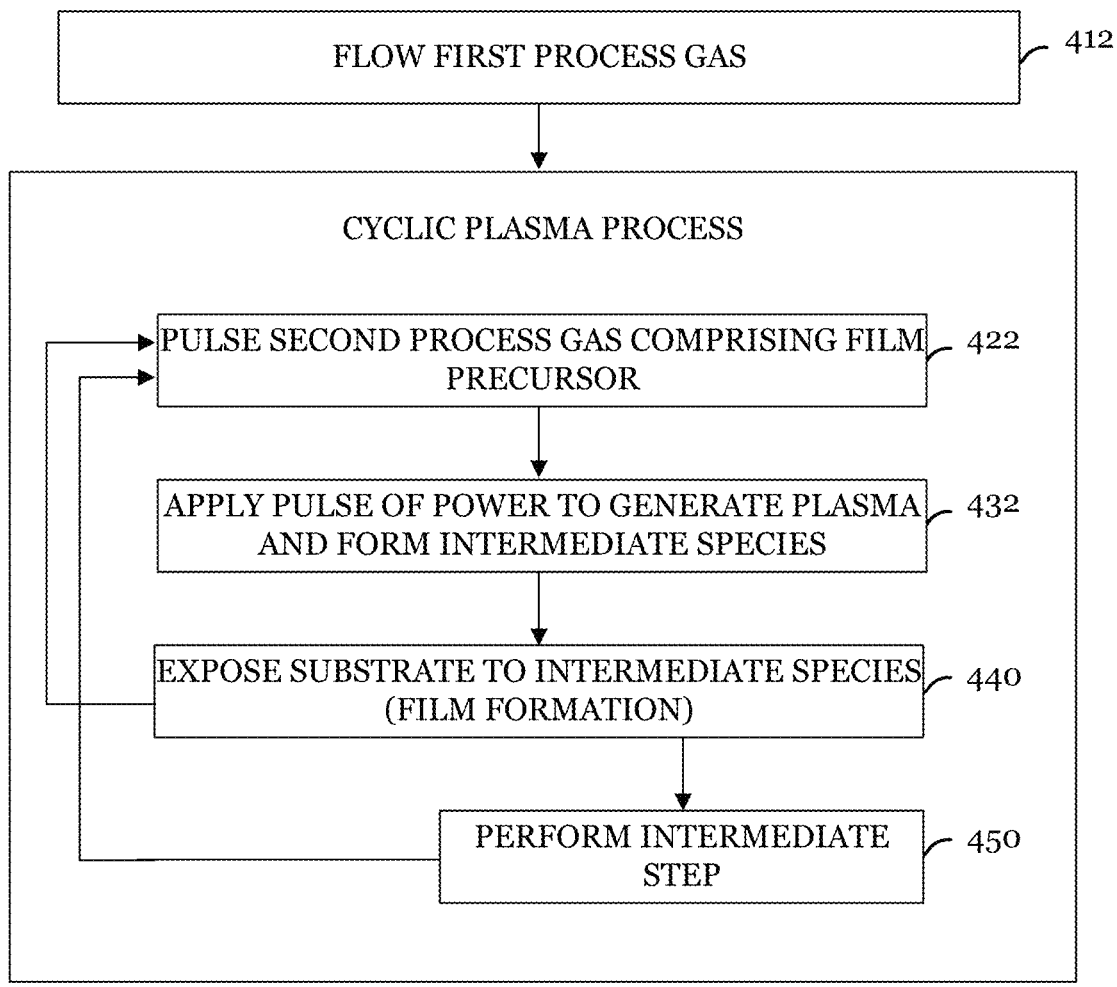
Figure 4C:
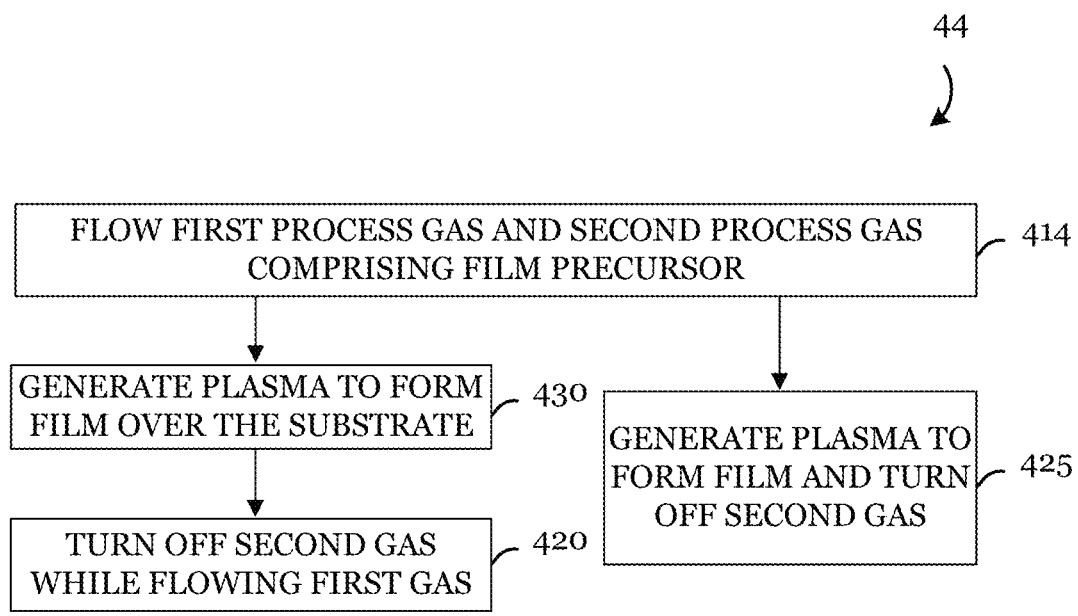
Figure 5:
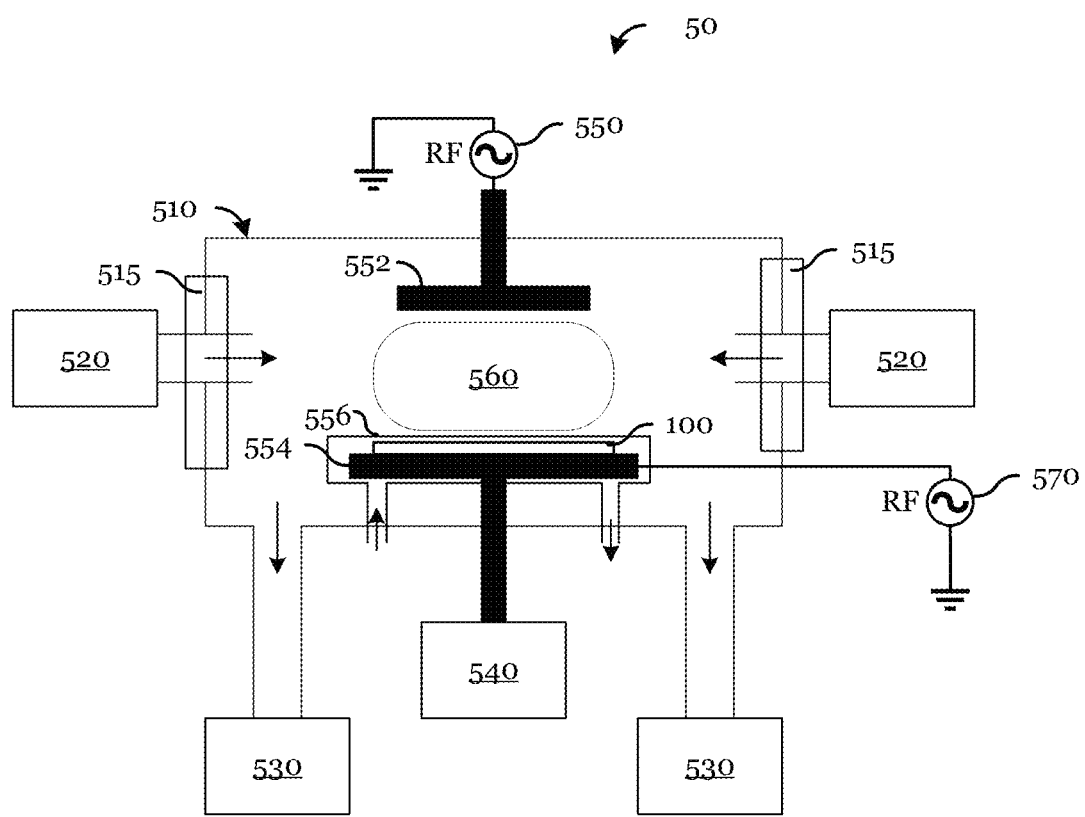
FIG. 5 illustrates a plasma system for performing a ps-PECVD process of in accordance with various embodiments.

In the following, these four stages of a pulse-shot plasma enhanced chemical vapor deposition (ps-PECVD) process are first described referring to FIGS. 1A-1D and 2A-2C. Next, two examples of a film formed over a substrate with different levels of conformality are described referring to FIGS. 3A and 3B. Example process flow diagrams are then illustrated in FIG. 4A-4C. FIG. 5 provides an example plasma system for performing the ps-PECVD process in accordance with various embodiments. All figures in this disclosure are drawn for illustration purpose only and not to scale, including the aspect ratios of features.

FIGS. 1A-1D illustrate cross sectional views of a substrate 100 with recesses at various stages during one exemplary ps-PECVD process in a plasma processing chamber in accordance with various embodiments.

Figure 1B:
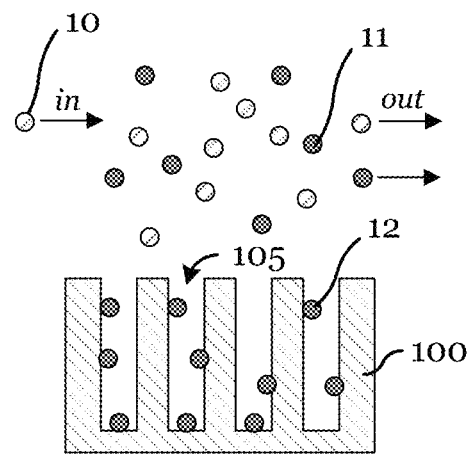
Figure 1C:
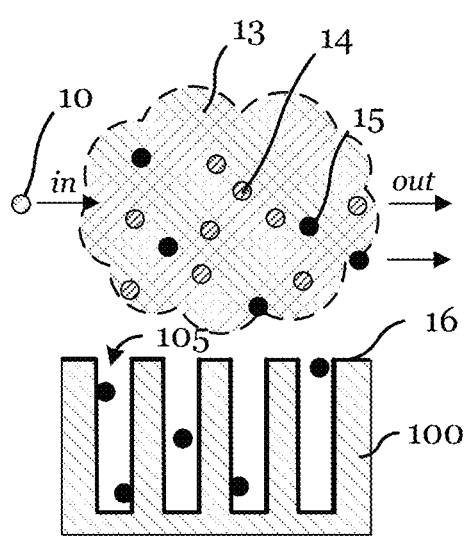
Figure 1D:
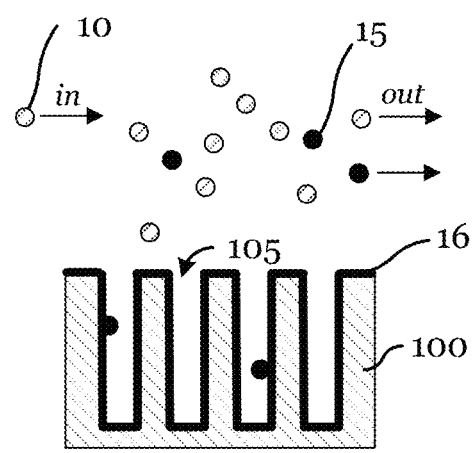
Figure 2A:
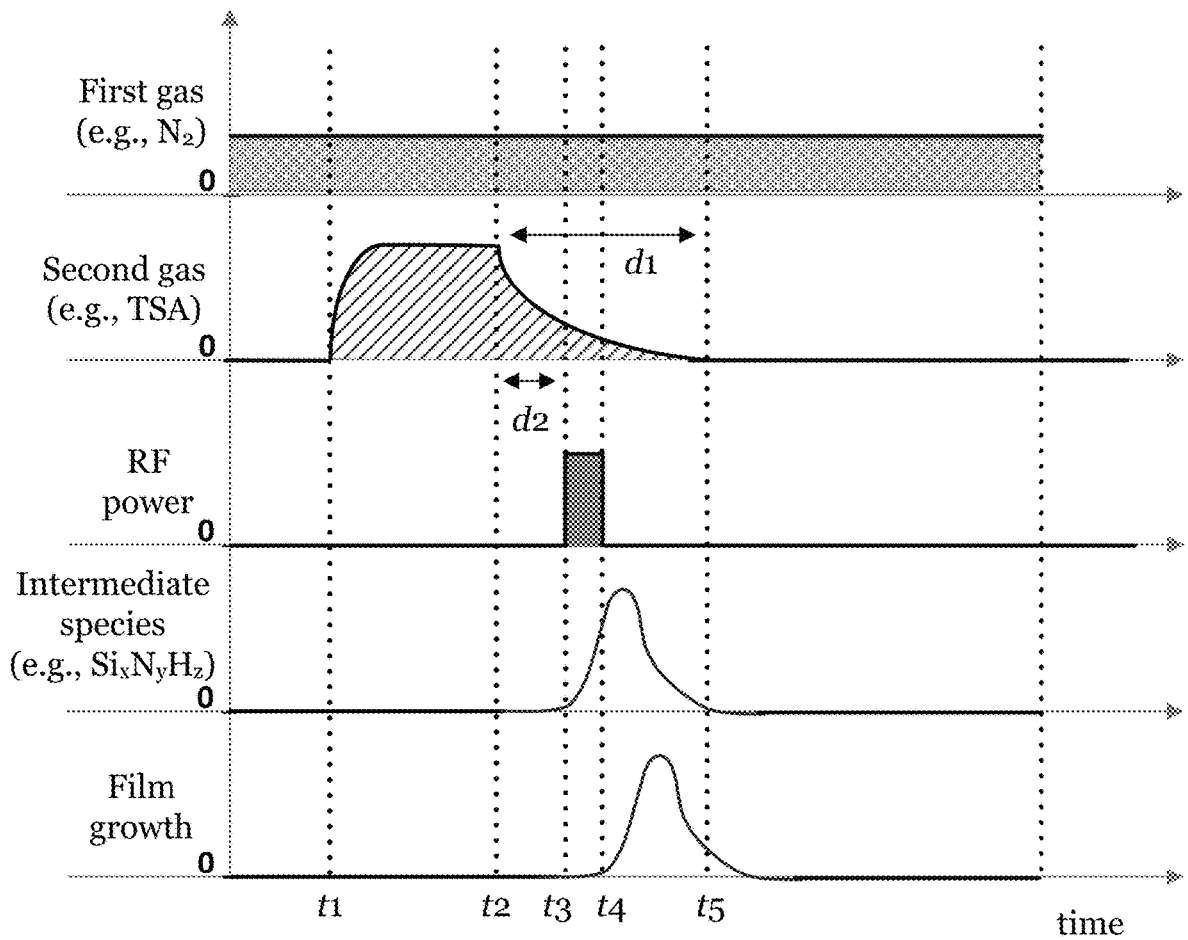
Figure 2B:
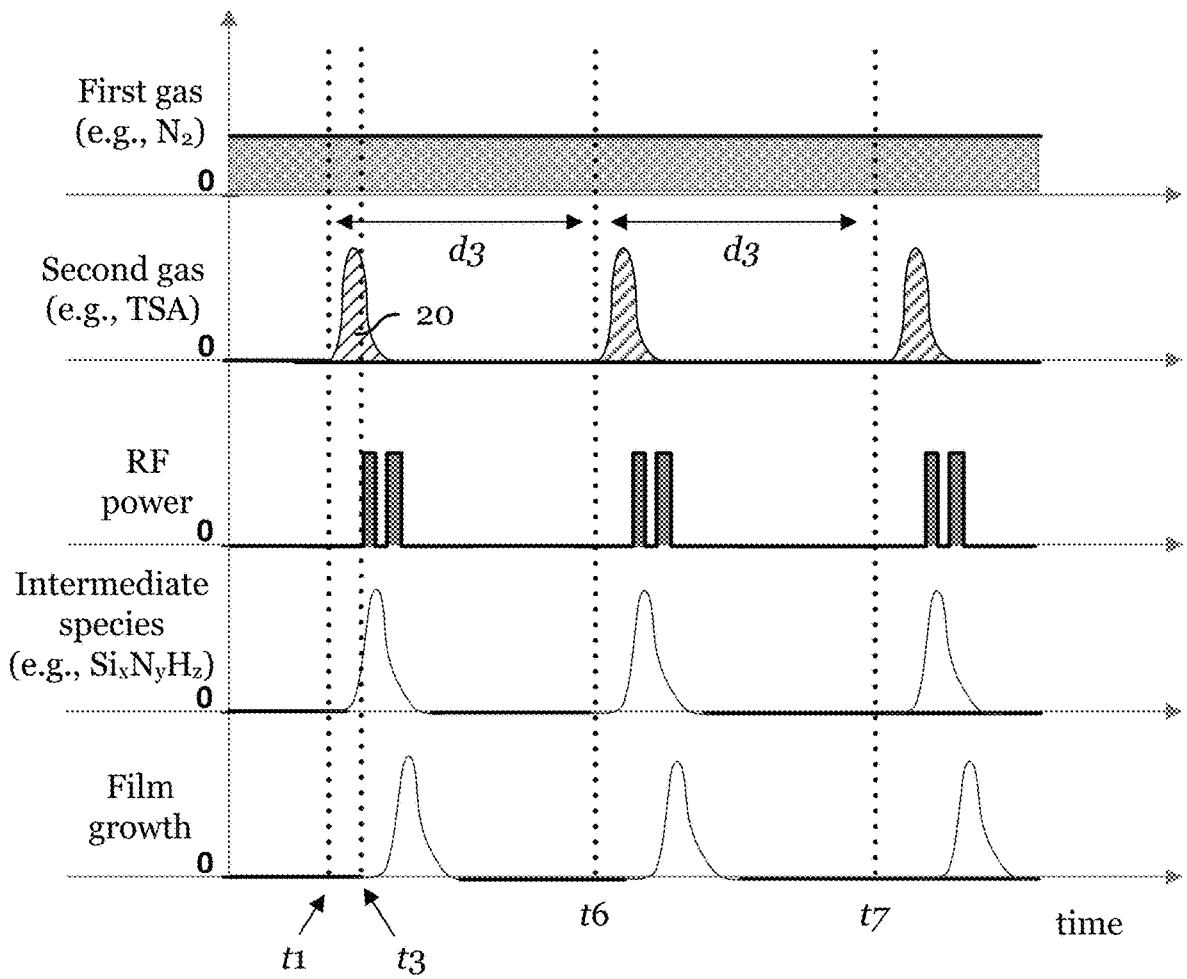
Figure 2C:
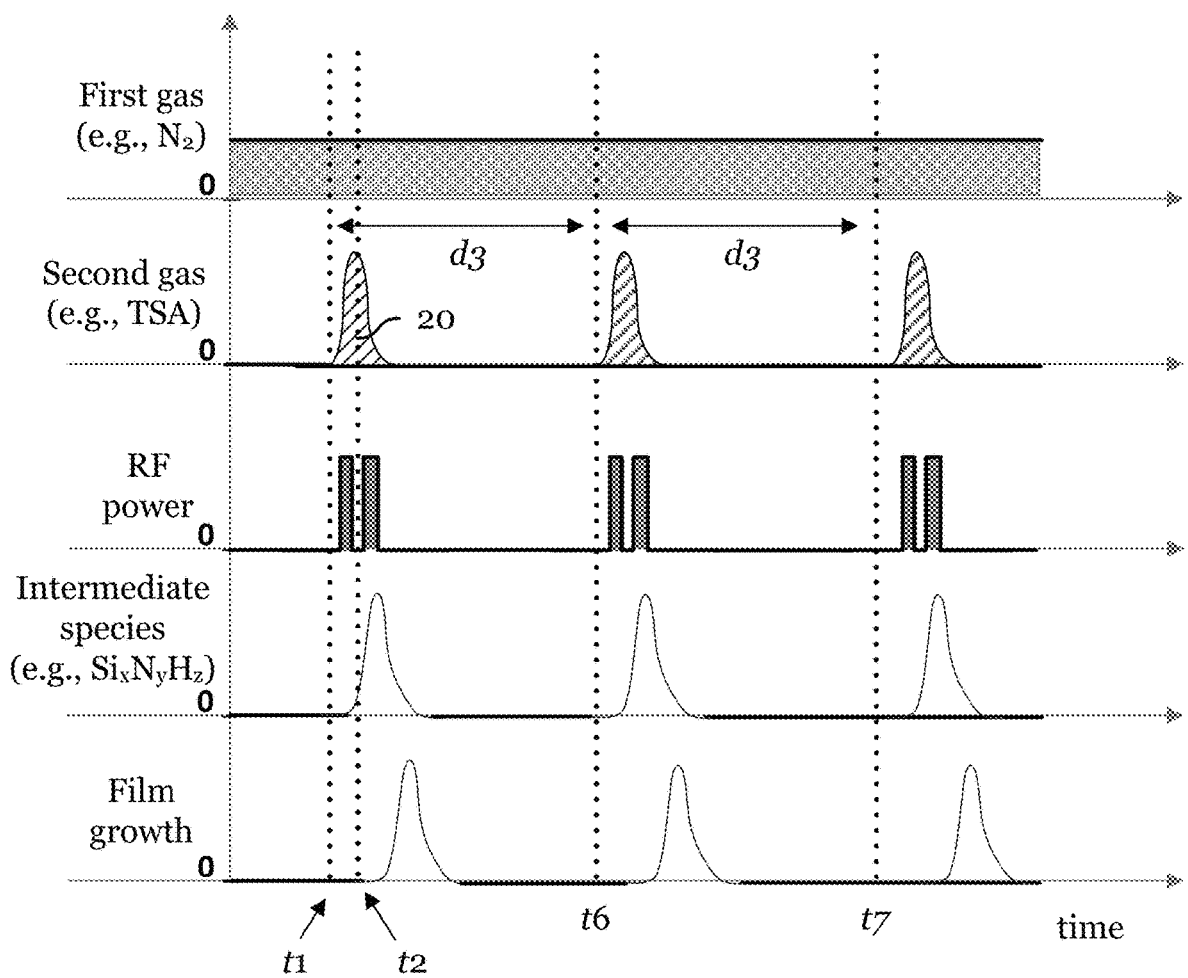

FIGS. 2A-2C illustrate timing diagrams for a cyclic implementation of a ps-PECVD process in accordance with various embodiment illustrated in FIGS. 1A-1D. The five horizontal axes in FIGS. 2A-2C represent progression in time. Three process parameters (i.e., the concentrations of two gases and radio frequency (RF) power for plasma generation), the concentration of intermediate species, and the film growth rate are plotted in FIGS. 2A-2C.

In FIG. 1A, the substrate 100 may comprises a semiconductor substrate in various embodiments. In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate. Alternatively, the substrate 100 may be a metallic substrate or a dielectric substrate. For instance, the substrate 100 may be aluminum, carbon (e.g. graphene), or silicon oxide. Additionally, the substrate 100 may include many different material layers and may be the top layer of a multilayer substrate. For example, the substrate 100 may be silicon oxide that is formed on top of another material.

The substrate 100 may be patterned, for example into one or more high aspect ratio features and/or 3D structures. In various embodiments, the features of the substrate 100 may comprise a contact hole, slit, or other suitable structures comprising a recess. In certain embodiments, the features of the substrate 100 may include various 3D structures and layers useful for example in 3D-NAND, 3D-NOR, or dynamic random access memory (DRAM) device as well as 3-D transistors. In FIG. 1A, recesses 105 are formed over the substrate 100. The patterning of the substrate 100 may be formed by a conventional method, for example, a lithography process to pattern an etch mask and a subsequent etch process.

FIG. 1A further illustrates the flow-in stage of the pulse-shot plasma enhanced chemical vapor deposition (ps-PECVD) process, where a first process gas 10 and a second process gas 11 are flowed to the plasma processing chamber. Multiple flow controllers may be used to individually control the flow rates of the two gases. In certain embodiments, as illustrated in FIG. 2A, the inflow of the second process gas may be started at time t1, after a constant inflow of the first process gas is established. In other embodiments, the two gases may be turned on at the same time. In one embodiment, the flow rate of the first process gas may be kept constant as illustrated in FIGS. 2A-2C, although in other embodiments, it may be changed at any stage during the ps-PECVD process.

In various embodiments, the two gases may be selected based on the chemical composition of a target film to be formed over the substrate 100. The target film may comprise, for example, a silicon dielectric material. In one embodiment the target film comprises silicon nitride. In other embodiments, the silicon dielectric material may comprise silicon carbide (SiC), silicon oxygen carbide (SiCO), silicon oxynitride (SiON), silicon carbon nitride (SiCN) or other materials. Further, the target film may comprise non-silicon-based oxides, carbides, or any other materials, for example, comprising boron (B), hydrogen (H), nitrogen (N), oxygen (O), carbon (C), or fluorine (F). These dielectric materials such as nitride materials may be advantageously used in the manufacture of microelectronic devices as barrier layers, passivation layers, dielectric layers, mask layers, and as substrates among others. In further embodiments, the target film may comprise a binary, ternary, tetranary compound that comprises a metal element such as titanium (Ti), iron (Fe), cobalt (Co), copper (Cu), zinc (Zn), gallium (Ga), germanium (Ge), arsenic (As), yttrium (Y), zirconium (Zr), indium (In), tin (Sn), antimony (Sb), hafnium (Hf), tantalum (Ta), or tungsten (W). In certain embodiments, the target film may comprise a metal nitride. In one embodiment, the target film may comprise titanium nitride. In the following, the method of ps-PECVD is described for nitrides, in particular silicon nitride as an exemplary film composition, although in other embodiments other film compositions may be used for the film formed by the ps-PECVD method of this disclosure.

In various embodiments, the first process gas 10 comprises H, C, N, O, or F. In certain embodiments, the first process gas 10 comprises a nitrogen compound. For example, the nitrogen compound may be dinitrogen ($N_2$), ammonia ($NH_3$), hydrazine ($N_2H_4$), methylamine ($CH_3NH_2$), or the like. Having one or more nitrogen compounds in the first process gas 10 may help the formation of reactive nitrogen species, for example dissociated nitrogen atoms, in the presence of a plasma during a later step (e.g., the pulse-shot plasma stage in FIG. 1C). Reactive nitrogen species may be important in formation of the target film comprising nitride materials. In certain embodiments, the first process gas 10 may comprise dihydrogen ($H_2$). Further, the first process gas 10 may also comprise an additional gas. The additional gas may for example comprise a noble gas such as helium (He), argon (Ar), neon (Ne), and krypton (Kr). In various embodiments, the flow rate of the first process gas 10 may be set so that the total gas flow is between 50 sccm to 5000 sccm.

The second process gas 11 may comprise a film precursor for the target film. In various embodiments, the second process gas 11 may comprise H, B, C, N, O, F, or Si. In certain embodiments, the second process gas 11 may comprise a metal element such as Ti, Fe, Co, Cu, Zn, Ga, Ge, As, Y, Zr, In, Sn, Sb, Hf, Ta, or W. In some embodiments, the second process gas 11 may comprise a silicon-containing molecule such as trisilylamine (TSA) or dichlorosilane (DCS). In other embodiments, the second process gas 11 comprises organosilane having one or more SiC bonds. In further embodiments, the second process gas 11 may comprise a silane that comprises Cl, C, H, N, or F, or a borane that comprises Cl, C, H, N, or F. In various embodiments, the flow rate of the second process gas 11 may be set so that the total gas flow rate is between 50 sccm to 5000 sccm. Further in FIG. 1A, arrows are illustrated to indicate inflows (two arrows on the left) and outflows (two arrows on the right) for the two gas flows. Accordingly, a constant pressure in the plasma processing chamber, for example between 10 mTorr to 10 Torr in one embodiment, may be maintained. At this stage, a portion of the precursor may be adsorbed over the substrate 100 as adsorbed precursor species 12.

In certain embodiments, the second process gas 11 may be flowed as a short pulse 20 at the time t1 to introduce only a small amount of the second process gas 11 to the plasma processing chamber as illustrated in FIG. 2B. In such embodiments, a gas pulse period of the short pulse 20 may be, for example 10 sec or less. For illustration purposes, three short pulses 20 are illustrated and separated to each other with a time duration d3 (with a second pulse at a time t6 and a third pulse at a time t7).

The inventors of this application identified that the film growth of materials such as silicon nitride by conventional PECVD techniques can be mostly driven by reactive ion species in the plasma. When the film growth is ion driven, the influx of species tends to be more directional (i.e., less isotropic) due to the electric field present in the plasma processing chamber. This trend may hamper the conformal film growth especially in a high aspect ratio structures that may be useful in 3D semiconductor devices. On the other hand, radical species are electronically neutral, and therefore their influx may be more isotropic. In order to achieve a good balance of ions and radicals, the inventors of this application conceived limiting the concentration of the second process gas 11 comprising a silicon-containing molecule, such as trisilylamine (TSA) or dichlorosilane (DCS), present in the plasma processing chamber and shortening a plasma process time. In various embodiments, limiting the concentration of the second process gas 11 may be achieved by pulsing the second process gas 11 or the flow-stop stage as described below referring to FIGS. 1B and 2A-2C.

In FIG. 1B, the inflow of the second process gas 11 is stopped at the flow-stop stage (at t2 in FIG. 2A). With the inflow of the first process gas 10 and the outflows of the two gases being still present, the concentration of the second process gas 11 decays over time as illustrated in FIG. 2A. After a sufficient time since t2 (a decay time d1 in FIG. 2A), the second process gas 11 will be completely purged and only the first process gas may remain in the plasma processing chamber (at t5 in FIG. 2A). In other words, the decay time d1 corresponds to a residence time of the second process gas 11. A portion of the adsorbed precursor species 12 may also be present if they are chemically adsorbed. A conventional atomic layer deposition (ALD) method may require such a stage (e.g., at t5 or later in FIG. 2A) where the precursor is only present on surface, and a subsequent process for film formation may proceed exclusively as on-surface reactions. In contrast, in various embodiments, the pulse-shot plasma enhanced chemical vapor deposition (ps-PECVD) process advantageously employ a plasma induced chemical reaction of the residual amount of the precursor in the gas phase as illustrated in FIGS. 1B and 1C. In other words, the ps-PECVD may proceeds to the next pulse-shot plasma stage (e.g., FIG. 1C) during the decay time d1, that is between t2 and t5, in FIG. 2A.

The pulse-shot plasma stage follows after the flow-stop stage. In various embodiments, the plasma may be generated by applying a RF power (at t3 in FIG. 2A). In certain embodiments, the RF source frequency may be between 30 MHz to 300 MHz. In one embodiment, the RF source frequency may be at least 60 MHz. In another embodiment, the RF source frequency may be between 160 MHz to 240 MHz. In various embodiments, the RF source power may be between 50 W to 10000 W and the bias power may be between 0 W and 200 W. Total gas flow may be between 50 sccm to 5000 sccm. Process pressure may be between 10 mTorr to 10 Torr. In certain embodiments, the power pulse period may be between 0.1 to 3 sec (time between t3 and t4 in FIG. 2A), while in other embodiments, the pulse period may be 5 sec or less. This pulse-shot plasma may be used to induce gas phase reactions to generate intermediate species for film formation. Applying the RF power (t3) may be performed with a delay time d2 after stopping the inflow of the second process gas 11 (t2). In various embodiments, the delay time d2 may be between 0 sec to 10 sec, although it may be longer in other embodiments.

In certain embodiments, at the time t3, a RF power may be applied as a pulse train comprising multiple power pulses (e.g., two pulses as illustrated in FIG. 2B).

In alternate embodiments, the pulse-shot plasma stage may start before stopping the flow of the second process gas 11 (i.e., t3 before t2), which may be beneficial to maximize the generation of intermediate species. In one embodiment, a RF power may be applied as a pulse train comprising multiple power pulses, and one of the power pulses may be applied prior to stopping the flow of the second process gas 11 (i.e., before t2) and another of the power pulses may be after the stopping (i.e., after t2), as illustrated in FIG. 2C.

As illustrated in FIG. 1C, a plasma 13 generated by applying the RF power may comprise energized species of the first process gas 14. Due to the energized species of the first process gas 14, the residual amount of the second process gas 11 may be reacted and generate intermediate species 15. In certain embodiments, the intermediate species 15 may comprise radical species. In one embodiment, the intermediate species 15 may comprise $Si_xN_yH_z$ radical species. In some embodiments, the plasma conditions may be optimized to maximize the concentration of radical species. Further, the intermediate species 15 may comprise elements from the first process gas 10 (e.g., nitrogen atoms). In various embodiments, the intermediate species 15 are then isotropically deposited over the substrate 100 to form a film 16. The presence of the intermediate species 15 in the gas phase differentiates the ps-PECVD process from an ALD process. While ALD is driven by surface reactions of adsorbed species, the ps-PECVD process, on the other hand, involves intermediate species formed in the gas phase. Further, the inventors of this application identified that the presence of radical species in the intermediate species 15 may drastically improve the isotropic film growth and thereby the conformality of the film 16 (e.g., uniform thickness of the film 16 within the recesses 105 and top surfaces of the substrate 100), as well as the uniformity of wet etch rate (WER) of the film 16. Therefore, the process conditions including parameters for the plasma 13 may be selected to optimize the concentration of the radical species in the intermediate species 15. As a result, the radical-driven film growth may be more prevalent and thus it may become possible to operate the ps-PECVD process while minimizing ion damage on the substrate 100 due to reactive ions.

As illustrated in FIGS. 2A-2C, the formation of intermediate species 15 may continue after turning off the RF power at time t4 due to any residual energized species of the first process gas 14 in the plasma processing chamber. Accordingly, the film growth may continue until the intermediate species 15 is completely depleted. The continued growth of the film 16 after turning off the RF power is illustrated in FIG. 1D, where the film 16 may grow in thickness uniformly across the substrate driven by the deposition of the intermediate species 15.

For the optimal film growth rate and the film quality of the film 16, the period of the delay time d2 (i.e., the timing of t3 to apply the RF power in FIGS. 2A-2C) may be critical. Accordingly, it may be useful to accurately determine the decay profile and the period of this decay time d1 (i.e., the residence time of the second process gas 11). Since the residence time depends on the amount of the second process gas 11 present in the plasma processing chamber at t2, and the flow rate of the first gas 10, the decay profile may be calculated based on these parameters. These parameters may be monitored by one or more sensors comprising, for example, pressure monitors, gas flow monitors, and/or gas species density monitors. In certain embodiments, the decay profile may be approximated as an exponential decay as a function of time t with a general formula $C=C_{t2} \times e^{-\alpha t}$, where C is the concentration of the second process gas 11, $C_2$ is C at t2, and $\alpha$ is a decay constant. The decay constant $\alpha$ may depend on the relationship of the chamber volume V and the gas flow rate of the first process gas 10. In one embodiment, based on the exponential decay approximation, the residence time may be considered to be the time when C is equal to 1% of $C_t$. In another embodiment, the residence time may be considered to be the time when C is equal to 5% of $C_{t2}$. $C_{t2}$ may be determined as N/V based on the equation of state PV=NkT, where N is the total number of moles of the second process gas 11 in the plasma process chamber, P is the partial pressure of the second process gas 11, k is the Boltzmann constant, and T is the temperature. In another embodiment, the residence time of the second process gas 11 may be determined as $N/q_{out}$, where $q_{out}$ is the number of moles in the outflow of the second process gas 11 and assumed to be constant. A gas species density monitor may be used to monitor and determine $q_{out}$. Although an exponential decay or a constant outflow of the second process gas 11 is assumed above, other methods of approximation, for example a Gaussian distribution, may also be used.

Although not specifically described in FIGS. 2A-2C, any other process parameters such as temperature may be controlled independently and/or changed at each stage of the ps-PECVD process in accordance with the respective process recipe.

In various embodiments, the ps-PECVD process may be performed temperatures below 500° C. In certain embodiments, the temperature of the substrate 100 may be kept between 250° C. to 500° C. This temperature range below 500° C. may advantageously reduce thermal damage to semiconductor device during manufacturing.

In various embodiments, the ps-PECVD process may be performed as a cyclic plasma deposition process by repeating the above described steps illustrated in FIGS. 1A-1D and 2. Process conditions for each cycle of the cyclic plasma deposition in accordance with various embodiments may be selected individually. The cyclic implementation of the ps-PECVD method may advantageously form the film 16 in a substantially layer-by-layer fashion, enabling high film conformality and/or precise thickness control. The ps-PECVD process may be performed to achieve a target film thickness. In one embodiment, the film thickness may be between 1 nm to 50 nm.

In certain embodiments, one cycle of the ps-PECVD process may comprise multiple pulses of plasma at the pulse-shot plasma stage, which may be beneficial in fine tuning the formation of intermediate species 15 when, for example, the decay time d1 is longer than several sec.

In the pulse-shot plasma enhanced chemical vapor deposition (ps-PECVD) process, precise control of the limited concentration of the intermediate species may be enabled by intelligently designing a process recipe. In particular, critical process parameters may include the gas flow rates, the timing of stopping the inflow of the second process gas or the pulse period thereof, and the timing, pulse period, and conditions of pulse-shot plasma. For example, selecting the delay time d2 (e.g., the time between t2 and t3 in FIG. 2A) may affect the process performance significantly. When a very short time period for the delay time d2 is selected (e.g., less than a tenth of the decay time d1), the residual concentration of the second process gas 11 comprising the precursor may approximates the initially set value, which may result in a relative abundance of intermediate species 15 in the pulse-shot plasma stage. This may be beneficial to provide a faster film growth rate per cycle but the film conformality and quality may be compromised. On the other hand, when the delay time d2 is prolonged (e.g., greater than a half of the decay time d1), the remaining concentration of the second process gas 11 is lowered. Therefore, the film growth rate per cycle may be slower but better film conformality and quality may be improved. In various embodiments, process parameters of the ps-PECVD may advantageously adjusted according to the required specification of film in semiconductor fabrication. Advantages of the ps-PECVD process may include (i) better film conformality and quality compared to available low-temperature PECVD processes that may rely on ion-driven film growth, and (ii) faster film growth and lower process temperature compared to ALD and/or plasma enhanced ALD (PEALD) processes.

In various embodiments, an intermediate step may be performed by exposing the substrate 100 to a treatment gas to modify surface functional groups on the substrate 100 or the film. The intermediate step may be performed prior to the flow-in stage, during or after the post-plasma film growth stage. The treatment gas may comprise, for example, hydrogen or ammonia ($NH_3$) although other reactive and/or inert gases may be used. The intermediate step may be beneficial in improving the film conformality and/or film quality by curing defects in the film and/or trimming. Further, the intermediate step may also comprise a plasma treatment using the treatment gas. In one embodiment, the intermediate step may be a plasma treatment using a plasma comprising hydrogen. In alternate embodiment, the intermediate step may be a thermal treatment, for example, performed by heating the substrate 100 under a flow comprising an inert gas or under vacuum.

Figure 3A:
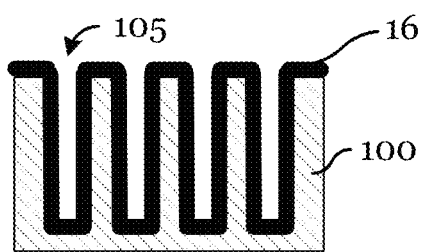
Figure 3B:
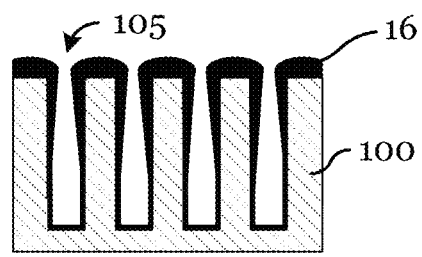

FIGS. 3A and 3B illustrate cross sectional views of a substrate 100 with recesses after completing a ps-PECVD process in accordance with various embodiments with different resulting film structures.

In FIG. 3A, the film 16 is uniformly formed over the substrate 100 with high film conformality including the walls of the recesses 105. As described above, achieving a conformal film growth, a fast film growth rate, and a moderate to low process temperature at the same time may be challenging with conventional deposition techniques especially in a high aspect ratio feature useful in 3D semiconductor devices. Advantageously, the cyclic implementation of the ps-PECVD method at 500° C. or lower may achieve the target film thickness without compromising the film conformality. In certain embodiments, the thickness variation of the film may be 10% or less of the average film thickness, for example, 0.5% to 5% in one embodiment. In one embodiment, the film 16 may comprise silicon nitride and may be used as a spacer material in 3D semiconductor devices such as DRAM.

In FIG. 3B, the film 16 has poor film conformality. The film thickness is not uniform across the substrate 100, thicker near the top surfaces of the substrate 100 and thinner at bottom half of the recesses 105. The inventors of this application identified that such a non-conformal deposition may often occur in conventional low-temperature plasma enhanced processes, which may be due to ion-driven film growth in these processes and poor isotropy of ion flux particularly in 3D structures such as high aspect ratio features. The thickness of the layer within a bottom surface of the recesses 105 reduces as the concentration of ions drop. The thickness variation of the film may be greater than 20% in this scenario with poor film conformality. This non-conformal deposition may be prevented by utilizing more isotropic, radical-driven film growth through the ps-PECVD method in accordance with various embodiments. Using the ps-PECVD, the concentration of the film precursor is limited and the plasma process time is shortened. As a result, radical species, for example comprising silicon and nitrogen for silicon nitride film formation, may increase while limiting ion species. As radical species are electronically neutral, they may be less subject to the effect of the electric field and thereby may be more isotropic. Further, compared to ions, radicals may diffuse slower and it may takes longer to form a film on surface, which can also be beneficial to improve the conformality of the film.

Notably, in addition to the film conformality, the uniformity of the film quality across the substrate 100 may be improved by the ps-PECVD method. For example, one important factor of the film quality is wet etch rate (WER). In particular, the WER in hydrofluoric (HF) acid is a key material property for a spacer material and must be low in dilute aqueous HF. The WER of a spacer may depend on crystallinity, morphology, density, stoichiometry, and trap density among others. The inventors of this application identified that many conventional low temperature processes may suffer high WER and/or uneven distribution of WER across the film in 3D structures. In one example, a wet etch may preferentially etch the film within recesses and consequently degrade the film conformality (i.e., less wet etch resistance of the film within the recesses). This issue of uneven WER, along with high WER, may be alleviated or eliminated by the isotropic, radical-driven film growth enabled by the ps-PECVD method in accordance with various embodiments FIGS. 4A-4C illustrate process flow diagrams of a ps-PECVD in accordance with various embodiments. The process flow can be followed with the figures discussed above (FIGS. 1A-1D and 2A-2C) and hence will not be described again.

In FIG. 4A, a process flow 40 starts with the flow-in stage by flowing a first process gas 10 and a second process gas 11 that comprises a film precursor to a plasma processing chamber holding a substrate 100 (block 410, FIG. 1A). Next, the flow-stop stage follows by stopping the inflow of the second process gas 11 while flowing the first process gas 10 (block 420, FIG. 1B). The process proceeds to the pulse-shot plasma stage by generating a plasma to form intermediate species 15 (block 430, FIG. 1C). The film starts to form as the intermediate species 15 are deposited over the substrate 100, and the post-plasma film growth stage (FIG. 1D) continues after turning off the source power to sustain the plasma.

In FIG. 4B, a process flow 42 illustrates a cyclic implementation of the ps-PECVD method, and starts with the flow-in stage by flowing a first process gas 10 (block 412) to a plasma processing chamber holding a substrate 100, and while flowing the first process gas 10, a cyclic plasma process may be performed. The cyclic plasma process may start by pulsing a second process gas 11 comprising a film precursor to the plasma processing chamber (block 422, FIGS. 1A and 1B). The pulsing corresponds to both the flow-in stage and the flow-stop stage in prior embodiments. Next, a pulse of RF source power may be applied to generate a plasma to form intermediate species 15 (block 432, FIG. 1C), followed by the post-plasma film growth stage (block 440, FIG. 1D) similar to the prior embodiments. In certain embodiments, after one cycle (blocks 422, 432, and 440) and before the next cycle, during any number of cycles, an intermediate step (block 450) may be performed by exposing the substrate 100 to a treatment gas to modify surface functional groups on the substrate 100 or the film.

In FIG. 4C, a process flow 44 illustrates an alternate embodiments of the ps-PECVD method, and starts with flowing a first process gas 10 and a second process gas 11 comprising a film precursor into a plasma processing chamber holding a substrate 100 (block 414, FIG. 1A). Next, an electrode of the plasma processing chamber may be powered to generate a plasma within the plasma processing chamber (block 430, FIG. 1C) and to form a film over the substrate 100. Within 5 sec after block 430, while maintaining the flow of the first process gas 10, shutting off the flow of the second process gas 11 (block 420, FIG. 1B). Alternately, powering the electrode and shutting off the flow of the second process gas 11 may be performed at the same time (block 425).

FIG. 5 illustrates a plasma system for performing a ps-PECVD process of in accordance with various embodiments.

For illustrative purposes, FIG. 5 illustrates a substrate 100 placed on a substrate holder 554 (e.g., a circular electrostatic chuck (ESC)) inside a plasma processing chamber 510 near the bottom. The substrate 100 may be optionally maintained at a desired temperature using a heater/cooler 556 that surrounds the substrate holder 554. The temperature of the substrate 100 may be maintained by a temperature controller 540 connected to the substrate holder 554 and the heater/cooler 556. The ESC may be coated with a conductive material (e.g., a carbon-based or metal-nitride based coating) so that electrical connections may be made to the substrate holder 554.

As illustrated in FIG. 5, the substrate holder 554 may be a bottom electrode of the plasma processing chamber 510. In the illustrative example in FIG. 5, the substrate holder 554 is connected to an RF-bias power source 570. A conductive circular plate inside the plasma processing chamber 510 near the top is the top electrode 552. In FIG. 5, the top electrode 552 is connected to an RF power source 550 of the plasma processing system 50. In some other embodiment, the top electrode may be a conductive coil located outside the plasma processing chamber 510 over a top ceramic window.

The gases may be introduced into the plasma processing chamber 510 by a gas delivery system 520. The gas delivery system 520 comprises multiple gas flow controllers to control the flow of multiple gases into the chamber. In some embodiments, optional center/edge splitters may be used to independently adjust the gas flow rates at the center and edge of the substrate 100. Further, the gas delivery system 520 may have a special showerhead configuration positioned at the top of the plasma processing chamber 510. For example, the gas delivery system 520 may be integrated with the upper electrode 522, having a showerhead configuration on the upper electrode 522, covering the entirety of the substrate 100, including a plurality of appropriately spaced gas inlets. Alternatively, gas may be introduced through dedicated gas inlets of any other suitable configuration. The plasma processing chamber 510 may further be equipped with one or more sensors 515 such as pressure monitors, gas flow monitors, and/or gas species density monitors. The sensors 515 may be integrated as a part of the gas delivery system 520 in certain embodiments. The sensors 515 and the gas flow controllers of the gas delivery system 520 may be used to determine and control the delay time d2 (e.g., the time between t2 and t3 in FIG. 2A) as well as the power pulse period (e.g., the time between t3 and t4 in FIG. 2A).

The RF-bias power source 570 may be used to supply continuous wave (CW) or pulsed RF power to sustain the plasma, such as a plasma 560. The plasma 560, shown between the top electrode 552 and the bottom electrode (also the substrate holder 554), exemplifies direct plasma generated close to the substrate 100 in the plasma processing chamber 510 of the plasma processing system 50.

The configuration of the plasma processing system 50 described above is by example only. In alternative embodiments, various alternative configurations may be used for the plasma processing system 50. For example, inductively coupled plasma (ICP) may be used with RF source power coupled to a planar coil over a top dielectric cover, the gas inlet and/or the gas outlet may be coupled to the upper wall, etc. In various embodiments, the RF power, chamber pressure, substrate temperature, gas flow rates and other plasma process parameters may be selected in accordance with the respective process recipe. In some embodiments, the plasma processing system 50 may be a resonator such as a helical resonator.

Example embodiments of the invention are summarized here. Other embodiments can also be understood from the entirety of the specification as well as the claims filed herein.

Example 1. A method of plasma processing that includes: flowing a first gas and a second gas into a plasma processing chamber including a substrate, the second gas including a film precursor; at a first time instance, while maintaining the flow of the first gas, shutting off the flow of the second gas into the plasma processing chamber; and at a second time instance after the first time instance, powering an electrode of the plasma processing chamber to generate a plasma within the plasma processing chamber, the surface of the substrate being exposed to the generated plasma to form a film over the substrate.

Example 2. The method of example 1, where the second time instance is separated from the first time instance by a time delay, the time delay being a residence time of the second gas in the plasma processing chamber or less.

Example 3. The method of one of examples 1 or 2, where the film precursor includes a silane that includes Cl, C, H, N, or F, or a borane that includes Cl, C, H, N, or F.

Example 4. The method of one of examples 1 to 3, where the film includes a dielectric material that includes Si, B, H, N, O, C, or F.

Example 5. The method of one of examples 1 to 4, where the first gas includes nitrogen or dinitrogen ($N_2$), and where the film includes silicon nitride or a metal nitride.

Example 6. The method of one of examples 1 to 5, further including: monitoring one or more of a pressure of the plasma processing chamber, a gas flow rate of the first process gas, a gas flow rate of the second process gas, a partial pressure of the first process gas, or a partial pressure of the second process gas; based on the monitoring, determine the timings of the first time instance and the second time instance.

Example 7. The method of one of examples 1 to 6, where the method is performed at a temperature of 500° C. or lower.

Example 8. The method of one of examples 1 to 7, where powering the electrode is performed by apply an RF power that has a frequency of at least 60 MHz.

Example 9. A method of forming a film over a substrate that includes: flowing a first gas to a plasma processing chamber holding the substrate; while flowing the first gas, performing a cyclic plasma process, the cyclic plasma process including a plurality of cycles, each of the plurality of the cycles including: pulsing a second gas including a film precursor into the plasma processing chamber; and applying a first pulse of power to an electrode coupled to the plasma processing chamber to generate a plasma to form gaseous intermediate species from the film precursor, the gaseous intermediate species being deposited over the substrate to form the film.

Example 10. The method of example 9, where the cyclic plasma process further including, after applying the first pulse of power, applying one or more subsequent pulses of power to the electrode.

Example 11. The method of one of examples 9 or 10, where applying the pulse of power is performed with a delay time relative to the pulsing of the second gas, the delay time being 10 sec or less.

Example 12. The method of one of examples 9 to 11, where the first gas includes nitrogen or dinitrogen ($N_2$), where the film precursor includes silicon, and where the film includes silicon nitride.

Example 13. The method of one of examples 9 to 12, where one or more of the plurality of the cycles further including performing an intermediate step, the intermediate step including exposing the substrate to a treatment gas to modify surface functional groups on the substrate or the film, the treatment gas including H, C, N, O, F, He, Ar, Ne, or Kr.

Example 14. The method of one of examples 9 to 13, where the treatment gas includes dihydrogen ($H_2$), dioxygen ($O_2$), or ammonia ($NH_3$).

Example 15. The method of one of examples 9 to 14, where the pulse period of the second gas is 10 sec or less, or where the pulse period of the power is 5 sec or less.

Example 16. The method of one of examples 9 to 15, where the substrate has a recess, and where the film has a thickness variation of 10% or less.

Example 17. A method of plasma processing that includes: flowing a first gas and a second gas including into a plasma processing chamber including a substrate, the second gas including a film precursor, the film precursor including H, B, C, N, O, F, Si, Ti, Fe, Co, Cu, Zn, Ga, Ge, As, Y, Zr, In, Sn, Sb, Hf, Ta, or W, where a temperature of the substrate is at 500° C. or lower; at a first time instance, powering an electrode of the plasma processing chamber to generate a plasma within the plasma processing chamber, the surface of the substrate being exposed to the generated plasma to form a film over the substrate; and at a second time instance, while maintaining the flow of the first gas, shutting off the flow of the second gas into the plasma processing chamber.

Example 18. The method of example 17, where the first time instance and the second time instance are same.

Example 19. The method of example 17, where the second time instance is within 5 sec after the first time instance.

Example 20. The method of one of examples 17 to 19, where powering the electrode includes applying a pulse of RF source power, the RF source power having a frequency at least 60 MHz.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing comprising:
flowing a first gas and a second gas into a plasma processing chamber comprising a substrate, the second gas comprising a film precursor, wherein the substrate has a recess;
at a first time instance, while maintaining the flow of the first gas, shutting off the flow of the second gas into the plasma processing chamber; and
at a second time instance after the first time instance, powering an electrode of the plasma processing chamber to generate a plasma within the plasma processing chamber, a surface of the substrate being exposed to the plasma to form a film over the substrate, wherein the film has a thickness variation of 10% or less.

2. The method of claim 1, wherein the second time instance is separated from the first time instance by a time delay, the time delay being a residence time of the second gas in the plasma processing chamber or less.

3. The method of claim 1, wherein the film precursor comprises a silane that comprises Cl, C, H, N, or F, or a borane that comprises Cl, C, H, N, or F.

4. The method of claim 1, wherein the film comprises a dielectric material that comprises Si, B, H, N, O, C, or F.

5. The method of claim 1, wherein the first gas comprises nitrogen or dinitrogen ($N_2$), and wherein the film comprises silicon nitride or a metal nitride.

6. The method of claim 1, further comprising:
monitoring one or more of a pressure of the plasma processing chamber, a gas flow rate of the first gas, a gas flow rate of the second gas, a partial pressure of the first gas, or a partial pressure of the second gas; and
based on the monitoring, determining timings of the first time instance and the second time instance.

7. The method of claim 1, wherein the method is performed at a temperature of 500° C. or lower.

8. The method of claim 1, wherein powering the electrode is performed by applying an RF power that has a frequency of at least 60 MHz.

9. A method of forming a film over a substrate, the method comprising:
flowing a first gas to a plasma processing chamber holding the substrate, wherein the substrate has a recess; and
while flowing the first gas, performing a cyclic plasma process, the cyclic plasma process comprising a plurality of cycles, each cycle of the plurality of cycles comprising:
pulsing a second gas comprising a film precursor into the plasma processing chamber; and
applying a first pulse of power to an electrode coupled to the plasma processing chamber to generate a plasma to form gaseous intermediate species from the film precursor, the gaseous intermediate species being deposited over the substrate to form the film, wherein the film has a thickness variation of 10% or less.

10. The method of claim 9, wherein the cyclic plasma process further comprises, after applying the first pulse of power, applying one or more subsequent pulses of power to the electrode.

11. The method of claim 9, wherein applying the first pulse of power is performed with a delay time relative to the pulsing of the second gas, the delay time being 10 sec or less.

12. The method of claim 9, wherein the first gas comprises nitrogen or dinitrogen ($N_2$), wherein the film precursor comprises silicon, and wherein the film comprises silicon nitride.

13. The method of claim 9, wherein one or more of the plurality of the cycles further comprises performing an intermediate step, the intermediate step comprising exposing the substrate to a treatment gas to modify surface functional groups on the substrate or the film, the treatment gas comprising H, C, N, O, F, He, Ar, Ne, or Kr.

14. The method of claim 13, wherein the treatment gas comprises dihydrogen ($H_2$), dioxygen ($O_2$), or ammonia ($NH_3$).

15. The method of claim 13, wherein the intermediate step is performed between pulsing the second gas and applying the first pulse of power to the electrode.

16. The method of claim 9, wherein a pulse period of the second gas is 10 sec or less, or wherein a pulse period of the power is 5 sec or less.

17. A method of forming a film over a substrate, the method comprising:

flowing a first gas to a plasma processing chamber holding the substrate; and while flowing the first gas, performing a cyclic plasma process, the cyclic plasma process comprising a plurality of cycles, each cycle of the plurality of cycles comprising:

pulsing a second gas comprising a film precursor into the plasma processing chamber;

applying a first pulse of power to an electrode coupled to the plasma processing chamber to generate a plasma to form gaseous intermediate species from the film precursor, the gaseous intermediate species being deposited over the substrate to form the film; and between pulsing the second gas and applying the first pulse of power, exposing the substrate to a treatment gas to modify surface functional groups on the substrate or the film, the treatment gas comprising dihydrogen ($H_2$), dioxygen ($O_2$), or ammonia ($NH_3$).

18. The method of claim 17, wherein applying the first pulse of power is performed with a delay time relative to the pulsing of the second gas, the delay time being 10 sec or less.

19. The method of claim 17, wherein a pulse period of the first pulse of power is 5 sec or less.

20. The method of claim 17, wherein the first gas comprises nitrogen, the second gas comprises silane or borane, wherein the substrate has a recess, and wherein the film has a thickness variation of 10% or less.

* * * * *